(12) United States Patent
Motoyama et al.

(10) Patent No.: US 11,062,904 B2
(45) Date of Patent: Jul. 13, 2021

(54) METHOD OF FORMING POLYSILICON FILM AND FILM FORMING APPARATUS

(71) Applicant: TOKYO ELECTRON LIMITED, Tokyo (JP)

(72) Inventors: Yutaka Motoyama, Nirasaki (JP); Atsushi Endo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 61 days.

(21) Appl. No.: 16/685,627

(22) Filed: Nov. 15, 2019

(65) Prior Publication Data

US 2020/0161130 A1 May 21, 2020

(30) Foreign Application Priority Data

Nov. 16, 2018 (JP) .............................. JP2018-215345

(51) Int. Cl.

| H01L 21/20 | (2006.01) |
|---|---|
| H01L 21/02 | (2006.01) |
| H01L 21/306 | (2006.01) |
| C23C 16/52 | (2006.01) |
| C23C 16/24 | (2006.01) |
| C23C 16/06 | (2006.01) |
| H01L 21/67 | (2006.01) |
| H01L 27/11582 | (2017.01) |
| H01L 27/11556 | (2017.01) |

(52) U.S. Cl.
CPC ........ *H01L 21/02667* (2013.01); *C23C 16/06* (2013.01); *C23C 16/24* (2013.01); *C23C 16/52* (2013.01); *H01L 21/0262* (2013.01); *H01L 21/02532* (2013.01); *H01L 21/02592* (2013.01); *H01L 21/02639* (2013.01); *H01L 21/30604* (2013.01); *H01L 21/67098* (2013.01); *H01L 27/11556* (2013.01); *H01L 27/11582* (2013.01)

(58) Field of Classification Search
CPC ......... H01L 21/02667; H01L 21/02532; H01L 21/30604; H01L 21/02639
See application file for complete search history.

(56) References Cited

U.S. PATENT DOCUMENTS

| 5,783,257 A * | 7/1998 | Shishiguchi ............ C23C 16/24 427/255.29 |
|---|---|---|
| 10,403,518 B2 * | 9/2019 | Nanba ..................... C09K 13/04 |
| 2004/0266080 A1 * | 12/2004 | Jyumonji ........... B23K 26/0648 438/166 |

(Continued)

FOREIGN PATENT DOCUMENTS

JP 2015-115435 A 6/2015

*Primary Examiner* — Caleb E Henry
(74) *Attorney, Agent, or Firm* — Nath, Goldberg & Meyer; Jerald L. Meyer; Tanya E. Harkins

(57) ABSTRACT

There is provided a method of forming a polysilicon film, which includes: forming an amorphous silicon film on a substrate; forming a cap layer, which is formed of an amorphous germanium film or an amorphous silicon germanium film, on the amorphous silicon film; forming crystal nuclei of a silicon in the amorphous silicon film by heating the substrate at a first temperature; removing the cap layer after the crystal nuclei are formed; and growing the crystal nuclei by heating the substrate from which the cap layer is removed, at a second temperature equal to or higher than the first temperature.

7 Claims, 7 Drawing Sheets

(56) References Cited

U.S. PATENT DOCUMENTS

| | | | | |
|---|---|---|---|---|
| 2006/0027762 | A1* | 2/2006 | Taniguchi | G03F 1/34 |
| | | | | 250/492.1 |
| 2006/0027809 | A1* | 2/2006 | Ogawa | H01L 21/02678 |
| | | | | 257/66 |
| 2008/0073573 | A1* | 3/2008 | Takami | B23K 26/0622 |
| | | | | 250/492.2 |
| 2008/0230725 | A1* | 9/2008 | Taniguchi | B23K 26/066 |
| | | | | 250/492.22 |
| 2008/0305618 | A1* | 12/2008 | Iga | H01L 21/02609 |
| | | | | 438/479 |
| 2009/0014828 | A1* | 1/2009 | Mizushima | H01L 27/115 |
| | | | | 257/506 |
| 2009/0134394 | A1* | 5/2009 | Azuma | H01L 27/1285 |
| | | | | 257/66 |
| 2009/0278169 | A1* | 11/2009 | Hayashi | H01L 29/66068 |
| | | | | 257/183 |

* cited by examiner

US 11,062,904 B2

METHOD OF FORMING POLYSILICON FILM AND FILM FORMING APPARATUS

CROSS-REFERENCE TO RELATED APPLICATION

This application is based upon and claims the benefit of priority from Japanese Patent Application No. 2018-215345, filed on Nov. 16, 2018, the entire contents of which are incorporated herein by reference.

TECHNICAL FIELD

The present disclosure relates to a method of forming a polysilicon film and a film forming apparatus.

BACKGROUND

There is known a technique for forming a polysilicon film having a large grain size by laminating a second amorphous silicon film on a first amorphous silicon film, in which crystal growth in the second amorphous silicon film is faster than that in the first amorphous silicon film, and performing crystallization treatment (e.g., Patent Document 1).

PRIOR ART DOCUMENT

Patent Documents

Patent Document 1: Patent Japanese Laid-Open Patent Publication No. 2015-115435

SUMMARY

According to an embodiment of the present disclosure, there is provided a method of forming a polysilicon film, which includes: forming an amorphous silicon film on a substrate; forming a cap layer, which is formed of an amorphous germanium film or an amorphous silicon germanium film, on the amorphous silicon film; forming crystal nuclei of a silicon in the amorphous silicon film by heating the substrate at a first temperature; removing the cap layer after the crystal nuclei are formed; and growing the crystal nuclei by heating the substrate from which the cap layer is removed, at a second temperature equal to or higher than the first temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1A:
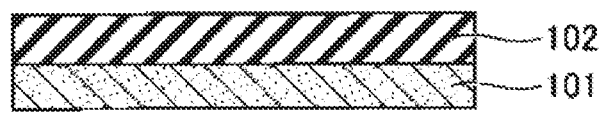
FIG. 1A to 1F are cross-sectional process views illustrating an example of a polysilicon film forming method.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted.

[Polysilicon Film Forming Method]

A polysilicon film forming method according to an embodiment will be described. FIG. 1A to 1F are cross-sectional process views illustrating an example of the polysilicon film forming method.

First, a substrate 101 on which an insulating film 102 is formed is prepared (see FIG. 1A). An example of the substrate 101 may include a semiconductor substrate such as a silicon substrate. An example of the insulating film 102 may include a silicon oxide film ($SiO_2$ film) or a silicon nitride film (SiN film).

Figure 1B:
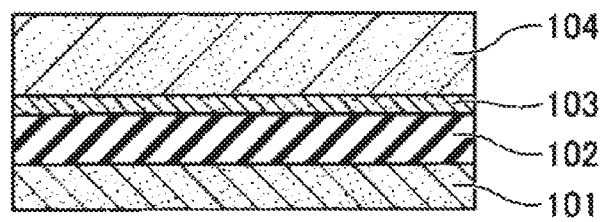

Subsequently, a seed layer forming step of supplying a silicon raw material gas for seed layer onto the substrate 101 to form a seed layer 103 on the insulating film 102 is performed (see FIG. 1B). In one embodiment, the seed layer 103 is formed using an aminosilane-based gas as the silicon raw material gas for seed layer. An example of the aminosilane-based gas may include diisopropylaminosilane (DIPAS), tri(dimethylamino)silane (3DMAS), bis(tertiarybutylamino)silane (BTBAS) or the like. In some embodiments, the seed layer 103 may be formed using a higher-order silane-based gas including two or more silicon (Si) in one molecule as the silicon raw material gas for seed layer. Examples of the higher-order silane-based gas may include $Si_2H_6$, $Si_3H_8$, $Si_4H_{10}$ and the like. In some embodiments, the seed layer 103 may be formed using a hydrogenated silane gas and a halogen-containing silicon gas as the silicon raw material gas for seed layer. Examples of the hydrogenated silane gas may include $SiH_4$, $Si_2H_6$, $Si_3H_8$ and the like. Examples of the halogen-containing silicon gas may include a fluorine-containing silicon gas such as $SiF_4$, $SiHF_3$, $SiH_2F_2$, $SiH_3F$ or the like, a chlorine-containing silicon gas such as $SiCl_4$, $SiHCl_3$, $SiH_2Cl_2$ (DCS), $SiH_3Cl$ or the like, or a bromine-containing silicon gas such as $SiBr_4$, $SiHBr_3$, $SiH_2Br_2$, $SiH_3Br$ or the like. The seed layer 103 is not limited to any of the above-mentioned single layer films, but may be a laminated film formed by a combination thereof. As the method of forming the seed layer 103, for example, a chemical vapor deposition (CVD) method may be used. In addition, when using the aminosilane-based gas as the silicon raw material gas for seed layer, it is preferable to perform the step at a temperature at which thermal decomposition does not occur. By forming the seed layer 103 on the insulating film 102 in this manner, it is possible to reduce the roughness of a silicon film formed on the seed layer 103. An amorphous silicon film 104 to be described later may be formed on the insulating film 102 without forming the seed layer 103.

Subsequently, a silicon film forming step of supplying a silicon raw material gas onto the substrate 101 to form an amorphous silicon film 104 on the seed layer 103 is performed (see FIG. 1B). In one embodiment, the amorphous silicon film 104 is formed on the seed layer 103 by supplying the silicon raw material gas through, for example, a CVD method, in the state in which the substrate 101 is heated. The amorphous silicon film 104 may be a non-doped silicon film or an impurity-doped silicon film. An example of the impurity may include boron (B), phosphorus (P), arsenic (As), oxygen (O), or carbon (C). An example of the silicon raw material gas may include one of a hydrogenated silane gas, a halogen-containing silicon gas, and an aminosilane system gas or a combination thereof as long as it is applicable to the CVD method. An example of the hydrogenated silane gas may include $SiH_4$, $Si_2H_6$, or $Si_3H_8$. An example of the halogen-containing silicon gas may include a fluorine-containing silicon gas such as $SiF_4$, $SiHF_3$, $SiH_2F_2$, or $SiH_3F$, a chlorine-containing silicon gas such as $SiCl_4$, $SiHCl_3$, $SiH_2Cl_2$ (DCS), or $SiH_3Cl$, or a bromine-containing silicon gas such as $SiBr_4$, $SiHBr_3$, $SiH_2Br_2$, or $SiH_3Br$. An example of the aminosilane-based gas may include diisopropylaminosilane (DIPAS), tri(dimethylamino)silane (3DMAS), or bis(tertiarybutylamino)silane (BTBAS). An example of the impurity-containing gas in the case of doping an impurity may include $B_2H_6$, $BCl_3$, $PH_3$, or $AsH_3$.

Figure 1C:
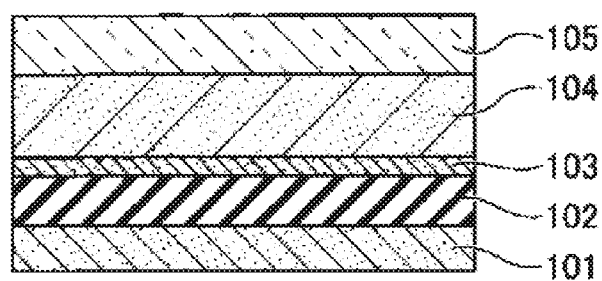

Subsequently, a cap layer forming step of supplying a germanium raw material gas onto the substrate 101 to form a cap layer 105 on the amorphous silicon film 104 is performed (see FIG. 1C). In this case, the cap layer 105 is formed of an amorphous germanium film. It is preferable to perform the cap layer forming step in a continuous manner without exposing the substrate 101 to atmosphere after the step of forming the amorphous silicon film 104. In addition, the cap layer 105 may be formed by supplying a mixed gas of the silicon raw material gas and the germanium raw material gas instead of the germanium raw material gas. In this case, the cap layer 105 is formed of an amorphous silicon germanium film. As the germanium raw material gas, a hydrogenated germane gas, a halogen-containing germanium gas, or an amino germane-based gas may be used. An example of the hydrogenated germane gas may include $GeH_4$, $Ge_2H_6$, or $Ge_3H_8$. An example of the halogen-containing germanium gas may include a fluorine-containing germanium gas such as $GeF_4$, $GeHF_3$, $GeH_2F_2$, or $GeH_3F$, a chlorine-containing germanium gas such as $GeCl_4$, $GeHCl_3$, $GeH_2Cl_2$, or $GeH_3Cl$, or a bromine-containing germanium gas such as $GeBr_4$, $GeHBr_3$, $GeH_2Br_2$, or $GeH_3Br$. An example of the amino germane-based gas may include dimethylamino germane (DMAG), diethylamino germane (DEAG), bis(dimethylamino)germane (BDMAG), bis(diethylamino)germane (BDEAG), and tri(dimethylamino)germane (3DMAG).

Figure 1D:
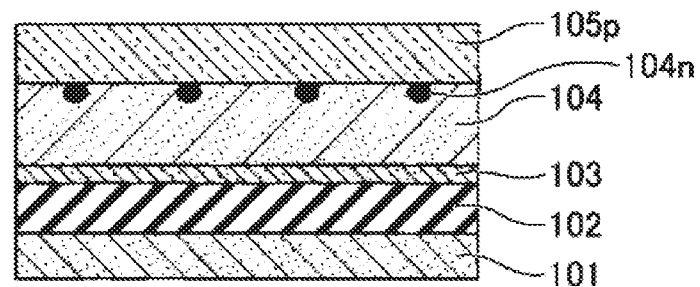

Subsequently, a first heat treatment step of heating the substrate 101 at a first temperature to form silicon crystal nuclei 104n in the amorphous silicon film 104 (see FIG. 1D). In one embodiment, the first temperature is a temperature equal to or higher than a crystallization temperature of the germanium film or the silicon germanium film, and may fall within a range of 450 degrees C. to 550 degrees C. As a result, the cap layer 105 formed of the germanium film or the silicon germanium film having a crystallization temperature lower than that of silicon is crystallized to form a crystallized film 105p. Due to the crystallization of the cap layer 105, a few crystal nuclei 104n are formed at the side of the crystallized film 105p in the amorphous silicon film 104.

Figure 1E:
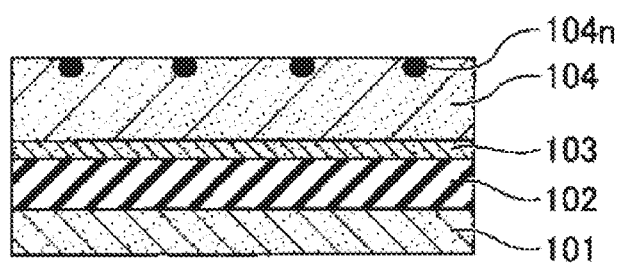
Figure 1F:
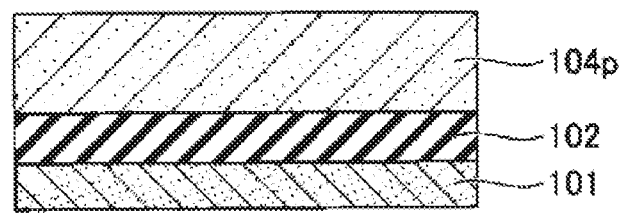

Subsequently, a removing step of removing the cap layer 105 (the crystallized film 105p) is performed (see FIG. 1E). In one embodiment, the crystallized film 105p may be removed by etching the crystallized film 105p using dilute hydrofluoric acid (dHF), removing a natural oxide film that may be formed on a surface of the crystallized film 105p, and subsequently, etching the crystallized film 105p using hydrogen peroxide solution ($H_2O_2$). In addition, the method of removing the crystallized film 105p is not limited to the above-described wet etching, and may be a dry etching using an etching gas. $Cl_2$ may be used as the etching gas. As an example, HCl, HBr, HI, $Br_2$, or $I_2$ may be used as the etching gas. However, in a case of forming a polysilicon film used as a channel layer for 3D NAND, the crystallized film 105p to be removed is formed on an inner wall of a recess having a high aspect ratio, and thus is difficult to remove by the dry etching. Thus, in the case of forming the polysilicon film used as a channel layer for 3D NAND, it is preferable to remove the crystallized film 105p by the wet etching.

Subsequently, a second heat treatment step is performed. The second heat treatment step includes heating the substrate 101, from which the crystallized film 105p has been removed, at a second temperature equal to or higher than the first temperature to grow the crystal nuclei 104n, and forming a polysilicon film 104p from the amorphous silicon film 104 (see FIG. 1F).

In one embodiment, the second temperature may be higher than the first temperature and may fall within a range of 550 degrees C. and 900 degrees C.

Through the above-mentioned steps, it is possible to form the polysilicon film 104p having an enlarged grain size on the substrate 101.

As described above, according to the polysilicon film forming method of the embodiment, after forming the cap layer 105 on the amorphous silicon film 104, the silicon crystal nuclei 104n are formed by the heat treatment. Thereafter, after removing the cap layer 105, crystallization is performed by growing the crystal nuclei 104n by the heat treatment. As a result, when the crystal nuclei 104n are formed, the cap layer 105 formed of germanium or silicon germanium having a lower crystallization temperature than that of silicon is crystallized first. In addition, due to the crystallization of the cap layer 105, the few crystal nuclei 104n are formed at the side of the cap layer 105 in the amorphous silicon film 104. In the heat treatment performed after removing the cap layer 105, the grains grow from the few crystal nuclei 104n formed at the side of the cap layer 105 in the amorphous silicon film 104. This increase the grain size. As a result, for example, when the polysilicon film 104p is used for a channel layer of a transistor, the mobility increases due to the increased grain size, and the performance of the transistor is improved.

(Film Forming Apparatus)

A film forming apparatus capable of carrying out the aforementioned polysilicon film forming method will be described by taking as an example a batch type vertical heat treatment apparatus that performs a heat treatment on plural sheets of substrates in a collective manner. However, the film forming apparatus is not limited to the batch type apparatus, and may be a single wafer type apparatus that processes substrates one by one.

Figure 2:
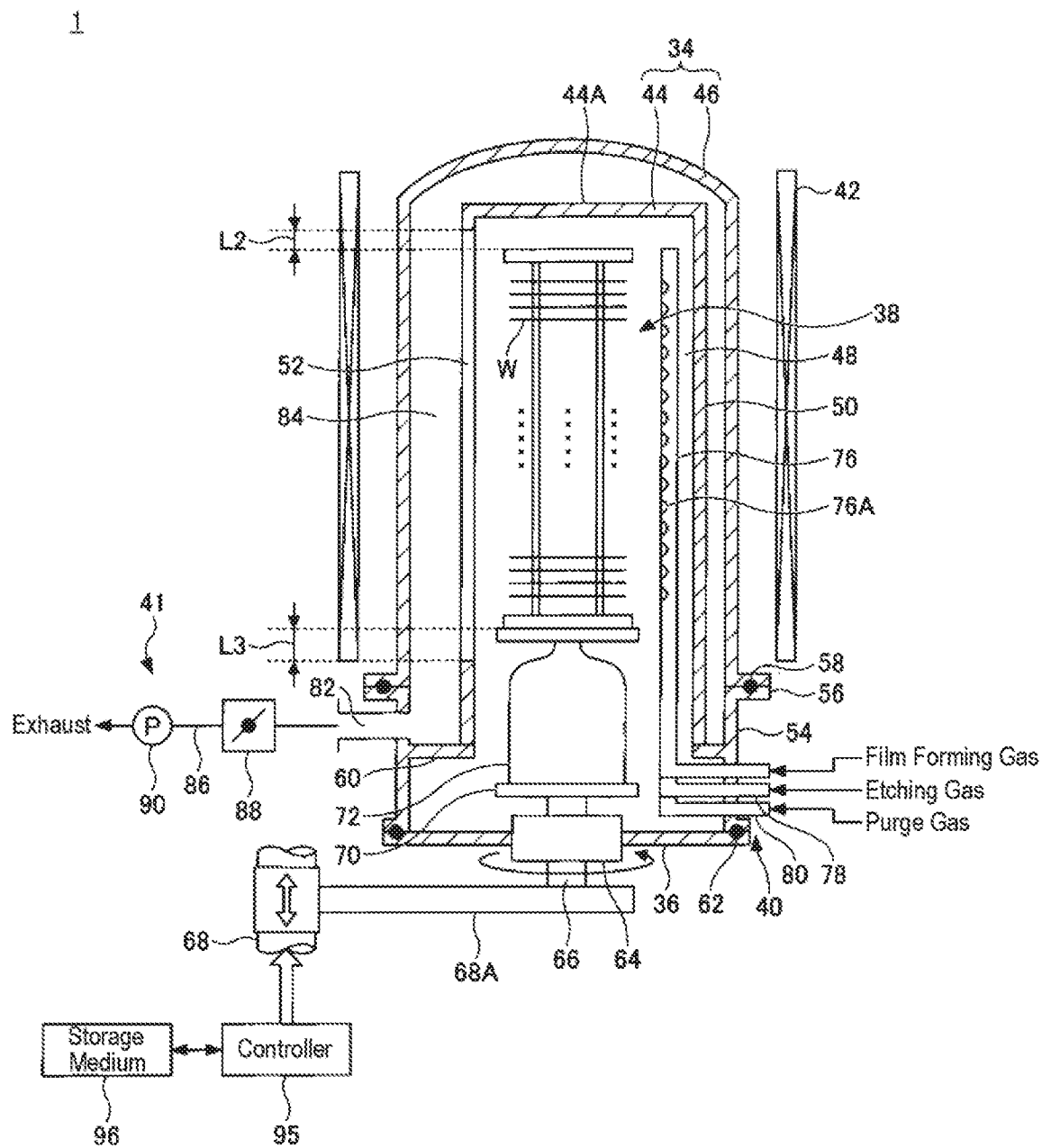
FIG. 2 is a vertical cross-sectional view illustrating an exemplary configuration of a vertical heat treatment apparatus.
Figure 3:
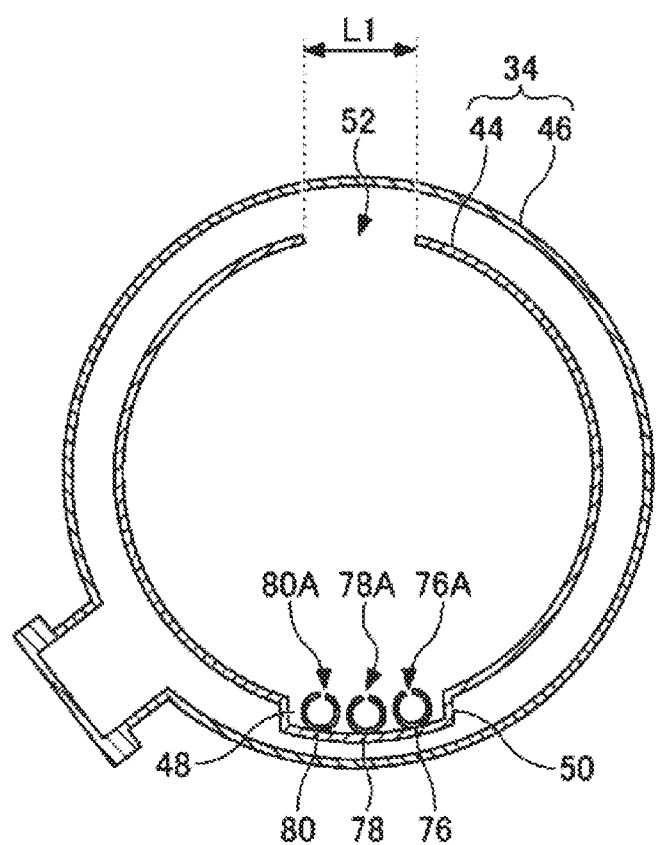
FIG. 3 is a view for explaining a reaction tube of the vertical heat treatment apparatus of FIG. 2.

FIG. 2 is a vertical cross-sectional view illustrating an exemplary configuration of the vertical heat treatment apparatus. FIG. 3 is a view for explaining a reaction tube of the vertical heat treatment apparatus of FIG. 2.

As illustrated in FIG. 2, the vertical heat treatment apparatus 1 includes a reaction tube 34, a lid 36, a wafer boat 38, a gas supply means 40, an exhaust means 41, and a heating means 42. The gas supply means 40, the exhaust means 41, and the heating means 42 are examples of a supply part, an exhaust part, and a heating part, respectively.

The reaction tube 34 is a processing container that accommodates the wafer boat 38. The wafer boat 38 is a substrate holder that holds a number of semiconductor wafers (hereinafter, referred to as "wafers W") at predetermined intervals. The reaction tube 34 includes a cylindrical inner tube 44 having a ceiling and an opened lower end, and a cylindrical outer tube 46 having a ceiling and an opened lower end to cover the outside of the inner tube 44. The inner tube 44 and the outer tube 46 are formed of a heat-resistant material such as, for example, quartz, and are arranged in a coaxial relationship with each other to form a double-tube structure.

A ceiling portion 44A of the inner tube 44 is, for example, flat. At one side of the inner tube 44, there is provided a nozzle accommodation portion 48 in which a gas supply pipe provided along a longitudinal direction (vertical direction) is accommodated. For example, as illustrated in FIG. 3, a portion of a sidewall of the inner tube 44 protrudes outward so as to form a convex portion 50. The inside of the convex portion 50 is formed as the nozzle accommodation portion 48. In a sidewall opposite the nozzle accommodation portion 48 in the inner tube 44, a rectangular opening 52 having a width L1 is formed in a longitudinal direction (vertical direction).

The opening 52 is a gas exhaust port formed to exhaust a gas inside the inner tube 44 therethrough. A vertical length of the opening 52 may be the same as that of the wafer boat 38. Alternatively, the opening 52 may be formed to vertically extend so as to have a length longer than that of the wafer boat 38. That is to say, an upper end of the opening 52 extends to a height above a position corresponding to an upper end of the wafer boat 38, and a lower end of the opening 52 extends to a height below a position corresponding to a lower end of the wafer boat 38. Specifically, as illustrated in FIG. 2, a distance L2 in the height direction between the upper end of the wafer boat 38 and the upper end of the opening 52 falls within a range of about 0 mm to 5 mm. A distance L3 in the height direction between the lower end of the wafer boat 38 and the lower end of the opening 52 falls within a range of about 0 mm to 350 mm.

A lower end of the reaction tube 34 is supported by a cylindrical manifold 54 made of, e.g., stainless steel. A flange portion 56 is formed on an upper end of the manifold 54. A lower end of the outer tube 46 is disposed on and supported by the flange portion 56. A seal member 58 such as an O-ring is interposed between the flange portion 56 and the lower end of the outer tube 46 to make the inside of the outer tube 46 airtight.

An annular support portion 60 is formed on an upper inner wall of the manifold 54. A lower end of the inner tube 44 is disposed on and supported by the support portion 60. A lid 36 is air-tightly attached to a lower end opening of the manifold 54 via a seal member 62 such as an O-ring. Thus, a lower end opening of the reaction tube 34, namely the lower end opening of the manifold 54, is air-tightly sealed. The lid 36 may be made of stainless steel.

A rotary shaft 66 is provided in the central portion of the lid 36 so as to penetrate through a magnetic fluid seal part 64. A lower portion of the rotary shaft 66 is rotatably supported by an arm 68A of an elevation mechanism 68 including a boat elevator.

A rotary plate 70 is provided on an upper end of the rotary shaft 66. The wafer boat 38 for holding the wafers W is mounted on the rotary plate 70 via a quartz thermal insulation container 72. Therefore, with the vertical movement of the elevation mechanism 68, the lid 36 and the wafer boat 38 are moved up and down together so that the wafer boat 38 can be loaded into and unloaded from the reaction tube 34.

The gas supply means 40 is provided in the manifold 54 and introduces a gas such as a film forming gas, an etching gas, a purge gas or the like into the inner tube 44. The gas supply means 40 includes a plurality of (e.g., three) quartz-made gas supply pipes 76, 78 and 80. Each of the gas supply pipes 76, 78 and 80 is provided inside the inner tube 44 along the longitudinal direction of the inner tube 44. A base end of each of the gas supply pipes 76, 78 and 80 is bent in an L-shape and supported so as to penetrate the manifold 54.

As shown in FIG. 3, the gas supply pipes 76, 78 and 80 are installed in a line along the circumferential direction inside the nozzle accommodation portion 48 of the inner tube 44. A plurality of gas holes 76A, 78A and 80A are formed in the respective gas supply pipes 76, 78 and 80 at predetermined intervals along the longitudinal direction of the gas supply pipes 76, 78 and 80, so that the respective gases can be ejected horizontally from the respective gas holes 76A, 78A and 80A. The predetermined interval may be set to be equal to an interval between the wafers W supported by the wafer boat 38. Further, a position in the height direction is set so that each of the gas holes 76A, 78A and 80A is located toward the middle between the wafers W adjacent to each other in the vertical direction, so that each gas can be efficiently supplied into a space between the wafers W. The kind of the gas includes the film forming gas, the etching gas and the purge gas. The gases are supplied from the respective gas supply pipes 76, 78 and 80 as necessary while controlling respective flow rates.

A gas outlet 82 is formed in an upper sidewall of the manifold 54 and above the support portion 60, so that a gas in the inner tube 44, which is discharged from the opening 52, can be exhausted through the gas outlet 82 via a space 84 between the inner tube 44 and the outer tube 46. The exhaust means 41 is provided at the gas outlet 82. The exhaust means 41 includes an exhaust passage 86 connected to the gas outlet 82. A pressure regulating valve 88 and a vacuum pump 90 are sequentially installed in the exhaust passage 86 to evacuate the inside of the reaction tube 34.

The heating means 42 of a cylindrical shape is provided at the outer peripheral side of the outer tube 46 so as to surround the outer tube 46. The heating means 42 heats the wafers W accommodated in the reaction tube 34.

The overall operation of the vertical heat treatment apparatus 1 is controlled by a controller 95, which is a control part. The controller 95 may include a computer. A computer program that performs the overall operation of the vertical heat treatment apparatus 1 is stored in a storage medium 96. The storage medium 96 may include a flexible disk, a compact disk, a hard disk, a flash memory, or a DVD.

An example of the method of manufacturing a polysilicon film on each wafer W using the vertical heat treatment apparatus 1 configured as above will be described. First, the wafer boat 38 that holds plural sheets of wafers W is loaded into the reaction tube 34 by the elevation mechanism 68. The lower end opening of the reaction tube 34 is hermetically closed and sealed by the lid 36. Subsequently, the controller 95 controls the operations of the gas supply means 40, the exhaust means 41, the heating means 42, and the like so as to execute the polysilicon film forming method. As a result, the polysilicon film having an enlarged grain size is formed on each wafer W.

Example 1

In Example 1, samples were manufactured by forming an amorphous germanium film on an amorphous silicon film formed on each substrate, and performing a heat treatment on each substrate at 450 degrees C. and 550 degrees C. for 4 hours. For comparison, samples were manufactured by performing the heat treatment on each substrate at 450 degrees C. and 550 degrees C. for 4 hours without forming an amorphous germanium film on an amorphous silicon film formed on each substrate. Then, for each of the samples thus manufactured, a crystalline state was evaluated through a grazing incident X-ray diffraction (GIXRD) method. The evaluation results are represented in FIGS. 4 and 5.

Figure 4:
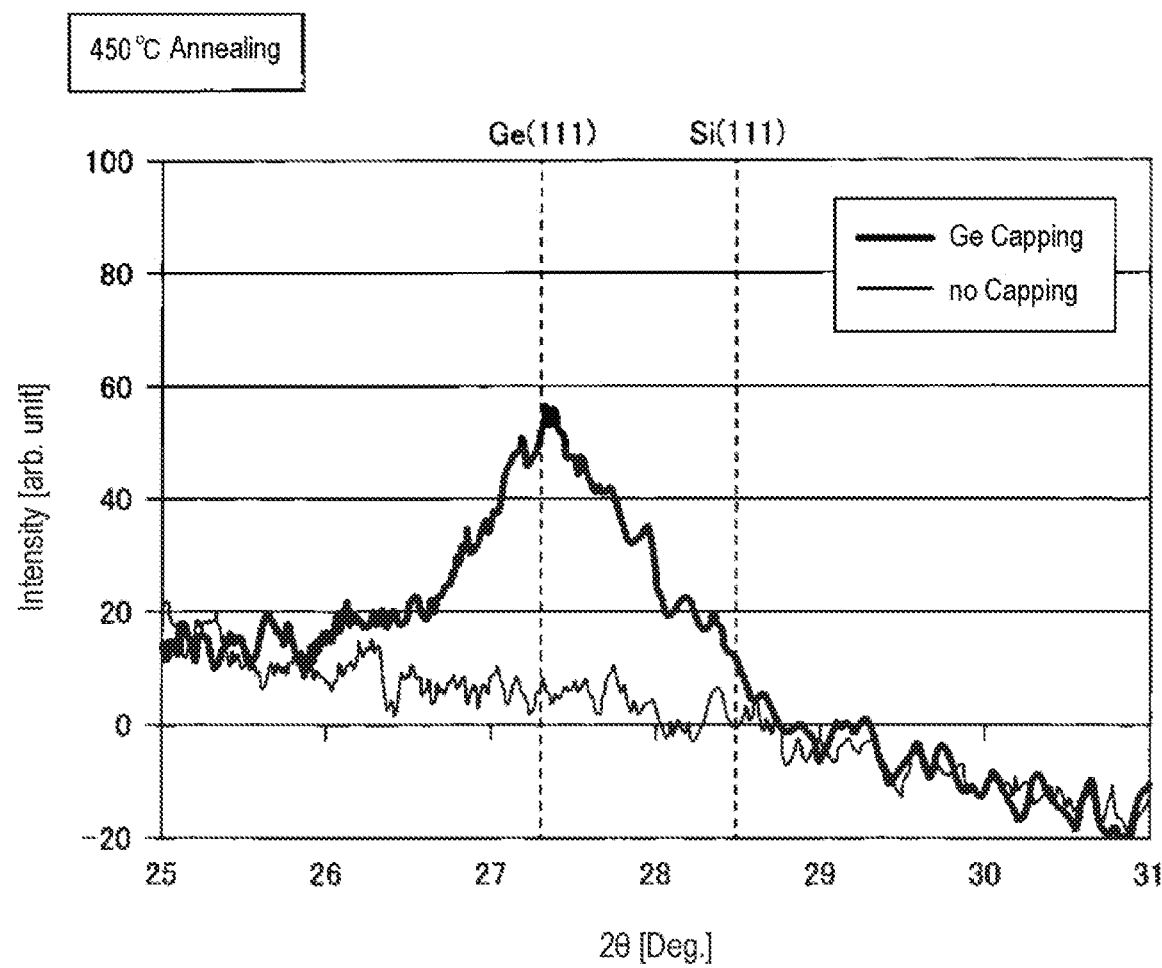
FIG. 4 is a view illustrating an example of the crystalline state of a sample in Example 1.
Figure 5:
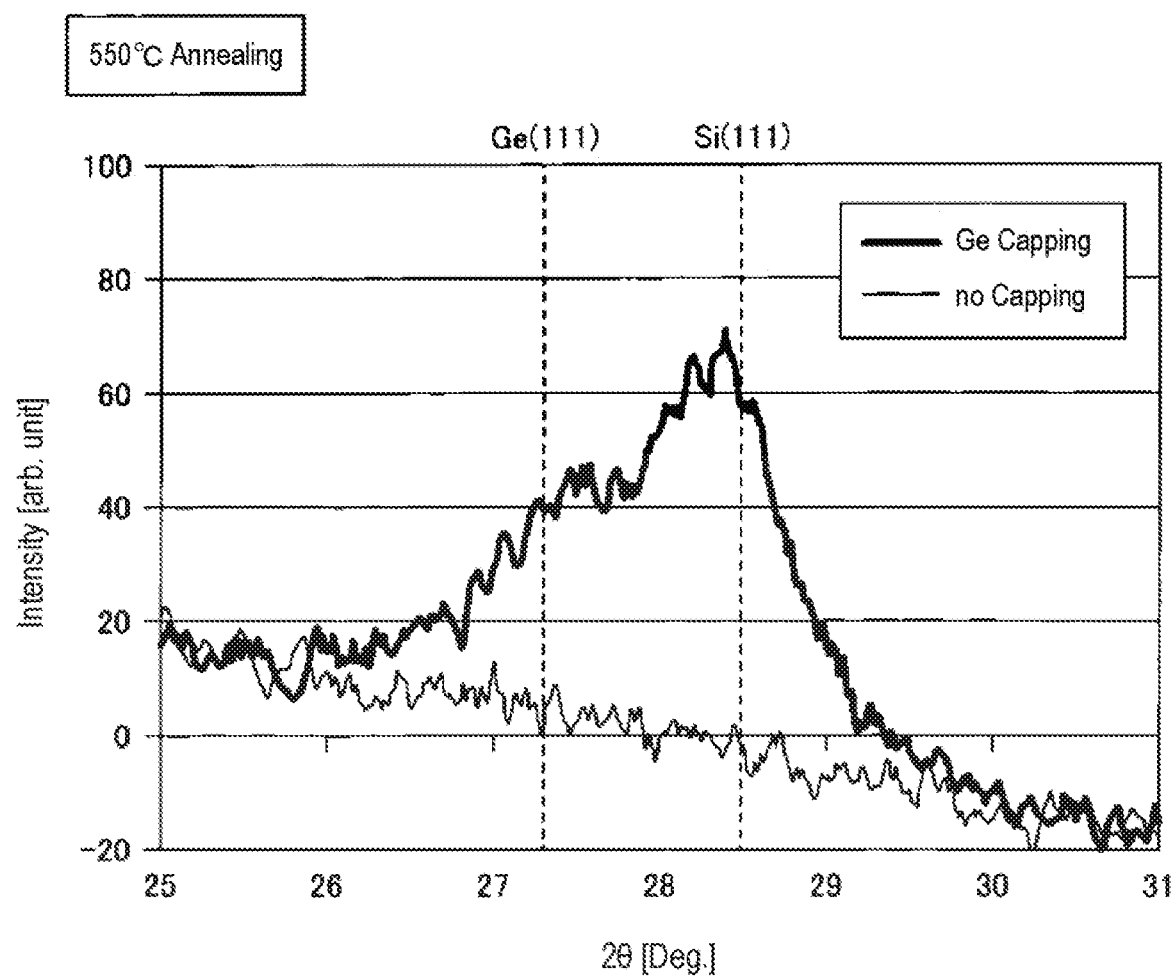
FIG. 5 is a view illustrating an example of the crystalline state of the sample in Example 1.

FIGS. 4 and 5 are views representing examples of the crystalline states of the samples obtained in Example 1. FIG. 4 represents the results obtained by measuring the samples through the GIXRD method when the heat treatment was performed at 450 degrees C., and FIG. 5 represents the results obtained by measuring the samples through the GIXRD method when the heat treatment was performed at 550 degrees C. In FIGS. 4 and 5, a diffraction angle 2θ [deg] is represented on the horizontal axes, and a diffraction X-ray intensity [arb·unit] is represented on the vertical axes. In FIGS. 4 and 5, the samples in each of which the amorphous germanium film is formed on the amorphous silicon film, are represented by thick solid lines, and the samples in each of which the amorphous germanium film is not formed on the amorphous silicon film, are represented by thin solid lines. In addition, peaks of (111) planes of germanium (Ge) and silicon (Si) are represented in the vicinity of 2θ=27.3 degrees and in the vicinity of 2θ=28.5 degrees, respectively (see broken lines in FIGS. 4 and 5).

As illustrated in FIG. 4, in the samples subjected to the heat treatment at 450 degrees C. after forming the amorphous germanium film on the amorphous silicon film, the peak of the (111) plane of Ge appeared and the peak of the (111) plane of Si slightly appeared. Meanwhile, in the samples subjected to the heat treatment at 450 degrees C. without forming the amorphous germanium film on the amorphous silicon film, the peak of the (111) plane of Si did not appear at all.

As illustrated in FIG. 5, in the samples subjected to the heat treatment at 550 degrees C. after forming the amorphous germanium film on the amorphous silicon film, the peak of the (111) plane became larger than that in the sample subjected to the heat treatment at 450 degrees C. Meanwhile, in the samples subjected to the heat treatment at 550 degrees C. without forming the amorphous germanium film on the amorphous silicon film, the peak of the (111) plane of Si did not appear at all.

From these facts, it can be seen that the amorphous germanium film is crystallized and the amorphous silicon film is also crystallized by performing the heat treatment at the temperature ranging from 450 degrees C. to 550 degrees C. after forming the amorphous germanium film on the amorphous silicon film. That is, it is estimated that the crystallization of the amorphous silicon film is promoted by the crystallization of the amorphous germanium film.

Example 2

In Example 2, samples were manufactured by forming an amorphous silicon film on each substrate, forming an amorphous germanium film on the amorphous silicon film, performing a heat treatment on each substrate at 525 degrees C. for 4 hours to remove the amorphous germanium film, and subsequently, performing the heat treatment at 750 degrees C. for 4 hours. For comparison, samples were manufactured by forming an amorphous silicon film on each substrate, and then performing the heat treatment at 750 degrees C. for 4 hours without forming an amorphous germanium film. Then, for each of the samples thus manufactured, a crystalline state was evaluated through the grazing incident X-ray diffraction (GIXRD) method. The evaluation results are represented in FIG. 6.

Figure 6:
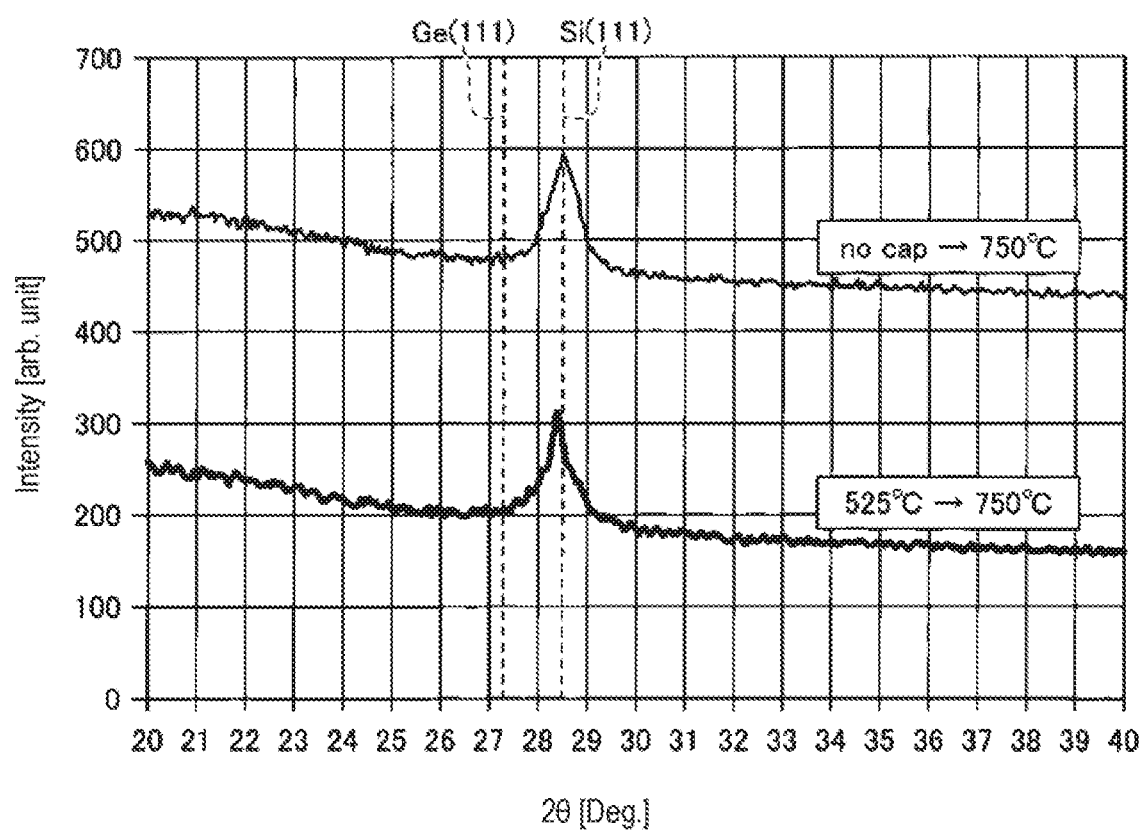
FIG. 6 is a view illustrating an example of the crystalline state of a sample in Example 2.

FIG. 6 is a view representing examples of crystalline states of the samples in Example 2. The results obtained by measuring the samples through the GIXRD method are represented. In FIG. 6, a diffraction angle 2θ [deg] is represented on the horizontal axis, and a diffraction X-ray intensity [arb·unit] is represented on the vertical axis. In FIG. 6, the sample, in which the amorphous germanium film was formed on the amorphous silicon film, is represented by a thick solid line, and the sample, in which the amorphous silicon film was not formed on the amorphous silicon film, is represented by a thin solid line. In addition, peaks of (111) planes of germanium (Ge) and silicon (Si) are represented in the vicinity of 2θ=27.3 degrees and in the vicinity of 2θ=28.5 degrees, respectively (see broken lines in FIG. 6).

As represented in FIG. 6, in the sample in which the amorphous germanium film was formed, the full width at half maximum (FWHM) became smaller than that in the sample in which the amorphous germanium film was not formed.

In this regard, it is estimated that the grain size of the silicon film is increased by forming the amorphous germanium film on the amorphous silicon film, performing the heat treatment at 525 degrees C. for 4 hours to remove the amorphous germanium film, and subsequently, performing the heat treatment at 750 degrees C. for 4 hours.

According to the present disclosure in some embodiments, it is possible to enlarge a grain size of a polysilicon film.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A method of forming a polysilicon film, the method comprising:
    forming an amorphous silicon film on a substrate;
    forming a cap layer, which is formed of an amorphous germanium film or an amorphous silicon germanium film, on the amorphous silicon film;
    forming crystal nuclei of a silicon in the amorphous silicon film by heating the substrate at a first temperature;
    removing the cap layer after the crystal nuclei are formed; and
    growing the crystal nuclei by heating the substrate from which the cap layer is removed, at a second temperature equal to or higher than the first temperature.

2. The method of claim 1, wherein the forming the cap layer is performed continuously without exposing the substrate to an atmosphere after the forming the amorphous silicon film.

3. The method of claim 1, wherein the second temperature is higher than the first temperature.

4. The method of claim 1, wherein the first temperature falls within a range of 450 degrees C. to 550 degrees C.

5. The method of claim 1, wherein the removing the cap layer includes etching the cap layer with a dilute hydrofluoric acid, and subsequently, etching the cap layer with a hydrogen peroxide solution.

6. The method of claim 1, further comprising:
    forming a seed layer on the substrate before the forming the amorphous silicon film.

7. A film forming apparatus comprising:

a processing container in which a substrate is accommodated;

a supply part configured to supply a silicon raw material gas, a germanium raw material gas, and an etching gas into the processing container;

an exhaust part configured to evacuate an interior of the processing container; and a heating part configured to heat the substrate; and a controller, wherein the controller is configured to control the supply part, the exhaust part, and the heating part to perform steps including:

forming an amorphous silicon film on the substrate by supplying the silicon raw material gas into the processing container;

forming a cap layer by forming an amorphous germanium film on the amorphous silicon film by supplying the germanium raw material gas into the processing container, or by forming an amorphous germanium film on the amorphous silicon film by supplying the silicon raw material gas and the germanium raw material gas into the processing container;

forming crystal nuclei of a silicon in the amorphous silicon film by heating the amorphous silicon film at a first temperature;

removing the cap layer after the crystal nuclei are formed; and growing the crystal nuclei by heating the substrate from which the cap layer is removed, at a second temperature equal to or higher than the first temperature.

\* \* \* \* \*